United States Patent [19]
Vaverka et al.

[11] Patent Number: 5,667,595
[45] Date of Patent: Sep. 16, 1997

[54] PROCESS FOR MANUFACTURING A SOLAR MODULE AND THE SOLAR MODULE PREPARED THEREBY

[75] Inventors: Ingrid Vaverka; Udo Gelderie; Karin Broering; Guenter Mattes, all of Aachen; Bernhard Reul, Herzogenrath, all of Germany

[73] Assignee: Saint-Gobain Vitrage, Courbevoie, France

[21] Appl. No.: 635,582

[22] Filed: Apr. 22, 1996

[30] Foreign Application Priority Data

Apr. 22, 1995 [DE] Germany ............... 195 14 908.4

[51] Int. Cl.$^6$ ............................................. H01L 31/048
[52] U.S. Cl. .................... 136/251; 257/433; 264/261; 438/64; 438/65
[58] Field of Search ............................. 136/251, 259; 257/433; 437/2, 211–212, 219

[56] References Cited

U.S. PATENT DOCUMENTS 5,578,142  11/1996  Hattori et al. .................. 136/251

*Primary Examiner*—Aaron Weisstuch
*Attorney, Agent, or Firm*—Oblon, Spivak, McClelland, Maier & Neustadt, P.C.

[57] ABSTRACT

A solar module, containing a front glass plate, a rear support plate and solar cells placed between these two plates, the hollow space between these same plates being filled with a cast polyether-polyurethane resin, and a method for the preparation of the solar module are provided.

20 Claims, No Drawings

PROCESS FOR MANUFACTURING A SOLAR MODULE AND THE SOLAR MODULE PREPARED THEREBY

BACKGROUND OF THE INVENTION

1. Field of the Invention

The present invention relates to a method for the manufacture of a solar module comprising a front glass plate, a rear support plate and solar cells placed between these plates, the hollow space between these same plates being filled with a cast polyetherpolyurethane resin.

2. Discussion of the Background

Cast resin filled solar modules are known under various forms and are used in the building sector and the motor-vehicle sector in order to produce electric current from solar energy. In such uses, the solar cells are placed between two plates and coated with a layer of cast resin to protect them from atmospheric effects.

The cast resin must satisfy a variety of requirements. For example, like the front glass plate, it must possess a high transparency to light, especially in the near-infrared range, in order to enable the solar cells to be highly efficient. In addition, the cast resin must be insensitive to ultraviolet rays and to moisture. Finally, complete and lasting adhesion to the front glass plate and to the solar cells must be ensured. The cured resin must also have sufficient elasticity such that the mechanical stresses coming into play because of the differences in thermal expansion coefficients of the various materials are low in the polymer layer and cannot therefore cause deformation of the module or disbandment of the adhesive surfaces.

DE 2,712,172 A1 discloses the use of polycarbonates, silicones, epoxides, polyesters, acrylic resins and polymerizable products of chain molecules, with mainly covalently bonded hydrocarbons and no added halogen atom, such as polypropylene, polyisoprene or polybutadiene, as materials for encapsulating the solar cells.

DE 2,825,034 A1 proposes using a resin containing acrylic-acid components in order to coat the solar cells between the two plates. This type of resin may possess, as main component, a mixture of methacryl methacrylate and a polyurethane prepolymer.

On the other hand, DE 3,428,775 A1 recommends the use of EVA, EMA, acrylic resins, silicone elastomers, PVB, epoxy resins or aliphatic polyesterurethanes in order to manufacture solar modules possessing the aforementioned structure, in order to insert the solar cells between the two plates.

The requirements regarding the properties of the cast resin for producing solar modules become even more demanding as the size of the modules increases. While the conventionally used resins give results which are completely satisfactory with respect to the production of solar modules of small format, most of the known resins for this objective pose problems when used in manufacturing larger modules, as is especially the case in the building sector. Thus, when acrylates such as those employed in normal practice are used, the reduction in volume of the resin on being cured induces large stresses which, over time, cause disbondment between the resin and the solar cells.

It is possible to avoid such phenomena with acrylates only by casting highly plastic and highly flexible acrylate resins.

However, such resin layers have very low mechanical strength, so that the solar module cannot exhibit the properties of safety glass, properties which are, however, recommended for facade-type installations.

Other materials, such as silicones, are not suitable for large-format solar modules, also because of inadequate mechanical properties (especially because of a lower tear strength and poor solidity). The use of aliphatic polyester-urethanes has proved to be no longer satisfactory. Although it is true that polyesterurethane-based resins are also known to cure with virtually no reduction in volume, it has, however, been possible to demonstrate that polyesterpolyol-based polyurethanes progressively undergo weathering by hydrolysis. This is why solar modules which include an intermediate layer made of polyesterpolyurethanes have the drawback of not being able to be used without additional sealing of the edges. Without such sealing, it would be impossible to prevent the edge region of the module from being damaged in the long-term by moisture.

SUMMARY OF THE INVENTION

Accordingly, one object of the present invention is to provide a material which is suitable as a cast resin for coating the photoelectric cells of solar modules, that overcomes the above noted difficulties.

Another object of the present invention is to provide a solar module containing such a cast resin.

Another object of the present invention is to provide a method for preparing such a solar module.

These and other objects of the present invention have been satisfied by the discovery that solar modules using a polyether-polyurethane cast resin as the filler between the front and support plates for coating the photoelectric cells of the solar modules provide superior properties such as mechanical strength and prevention of disbondment of the resin from the plates and the discovery of a method for the preparation of such a solar module.

DETAILED DESCRIPTION OF THE PREFERRED EMBODIMENTS

The solar modules of the present invention contain a polyetherpolyurethane as the cast resin, contrary to the conventionally used cast resins. The polyetherpolyurethane of the present invention exhibits minimal variations in volume on being cured, is not modified under the effect of moisture, and possesses, during the process for manufacturing the solar module, suitable viscosity characteristics for injection into the solar modulus, high adhesion to the surfaces of the plates and the solar cells, high tear strength, good solidity properties, as well as particular and pronounced properties from the point of view of rubber elasticity.

Furthermore, the resin is highly transparent to light rays, insensitive to ultraviolet radiation and maintains these properties over the long term, thus withstanding deterioration to a large extent. The present solar cells exhibit neither the phenomenon of disbondment nor yellowing even after a severe ageing test, performed under the effect of heat, cold temperature variations, radiation and moisture. Additionally, moisture does not cause darkening in the edge zone.

The viscosity of the resin may be varied depending on the choice of the metered quantities in the mixture of the isocyanate and polyol components, while still being within the desired limits of workability.

In accordance with the present invention, reactive mixtures comprising one or more aliphatic isocyanate prepolymers and one or more polyetherpolyols are employed as the cast resin. Preferred reactive mixtures are those in which the isocyanate components are made of a trifunctional aliphatic polyisocyanate based on 1,6-hexamethylene diisocyanate having a biuret or isocyanurate structure, with an NCO group content which may range from 12.8 to 26% of the weight and a weight average molecular weight of from 450 to 1000 g/mol, while the polyol components comprise a polyetherpolyol based on trimethylolpropane and on propylene oxide, with an OH group content of from 5.1 to 12.8% of the weight and a weight average molecular weight of approximately 400 to 1000 g/mol.

In accordance with the present invention, various additives can be added to the reactive mixture. Suitable additives include catalysts for accelerating the curing reaction, preferably dibutyltin dilaurate, UV-absorbing compounds, preferably based on a sterically hindered amine, as well as silanes, in order to increase adhesion of the resin layer to the glass plate, to the support plate, and to the solar cells.

The curing reaction preferably takes place at a high temperature, which may be between approximately 30° and 50° C.

It is preferred to carry out the curing reaction in an autoclave, under a slight overpressure of from about 0.3 to 1 bar. By means of this overpressure during the polymerization, it is possible to completely suppress any bubble formation in the resin which would be caused by evolution of carbon dioxide.

One preferred embodiment of the method of the present invention is as follows:

A 1×1 m$^2$ solar module is constructed as follows: the rear support plate and the front plate are both made of transparent material, preferably from sheets of float glass of approximately 5 mm in thickness. The front glass plate most preferably consists of a flint glass, which is capable of particularly high transmission of light and thermal radiation.

The solar cells are initially placed on and fixed to the support plate, which is itself laid horizontally in the desired position. The cells are then electrically connected together and the electrical connects are made to the outside at the desired place, along the edge of the glass support plate. Next, a strip of adhesive is deposited along the pane edge, for example by extrusion. This strip of adhesive serves two purposes. On the one hand, it guarantees sealing of the edges of the solar module and, on the other hand, it maintains a gap between the two sheets.

In two diagonally opposed corners, segments of a metal tube are installed which subsequently enable the hollow space lying between the two sheets to be filled and its air evacuated. Next, the front plate is installed and these two sheets are then clamped against each other so as to leave the desired space between them.

In order to produce the mass of cast resin, with which the hollow space lying between the glass sheets is filled, 500 grams of a necessarily trifunctional polyisocyanate, containing biuret groups, preferably based on 1,6-hexamethylene diisocyanate having a free NCO group content of 23% by weight and having a weight average molecular weight of 550 g/mol, are mixed with stirring, for 10 minutes at room temperature, with 800 grams of a trifunctional polyol based on trimethylolpropane having an OH group content of 11.8% by weight and having a number average molecular weight of 430 g/mol. As additives, 0.5 g of dibutyltin dilaurate (as catalyst), 50 g of a sterically hindered amine (as a means for protection against light) and 5 g of an aminosilane (as adhesion promoter) are preferably used. The NCO/OH ratio in the mixture is from 0.1 to 5, preferably from 0.3 to 1.0, most preferably 0.5. After homogenization the reaction mixture has a viscosity of approximately 1400 mPa.s at a temperature of 20° C.

Next, this resin mixture is poured into the hollow space lying between the two glass sheets, the solar module preferably being placed in a roughly vertical position. The mass of resin is injected via the bottom tube, while the top tube allows for evacuation of the air. After this filling operation, the two metal tubes are removed and the openings blocked up, such as by means of a mass of adhesive.

The solar module filled in this way, and therefore free of bubbles, is then installed in an autoclave. The temperature of the latter is raised to approximately 40° C. and the overpressure in the autoclave reaches about 0.6 bar. Under these conditions, the resin polymerizes and cures completely in from 30 minutes to 5 hours, preferably from 45 minutes to 2 hours, more preferably in 60 minutes.

Upon removing the cured product from the autoclave, the solar module is ready to be used.

This application is based on German Patent Application 195 14 908.4, filed with the German Patent Office on Apr. 22, 1995, the entire contents of which are hereby incorporated by reference.

Obviously, additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A solar module comprising a front plate and a rear support plate placed in parallel and having one or more solar cells placed therebetween, wherein remaining hollow space present between the front plate and the rear support plate is filled with a cast polyether-polyurethane resin.

2. The solar module according to claim 1, wherein the cast polyether-polyurethane resin comprises a reactive mixture of one or more aliphatic isocyanate prepolymers and one or more polyetherpolyols.

3. The solar module according to claim 2, wherein the one or more aliphatic isocyanate prepolymers comprise(s) a trifunctional aliphatic polyisocyanate prepared from 1,6-hexamethylene diisocyanate, having a biuret or isocyanurate structure, with an NCO group content of from 12.6 to 28% by weight and a weight average molecular weight of from about 450 to 1000 g/mol.

4. The solar module according to claim 2, wherein the one or more polyetherpolyols comprise(s) a polyetherpolyol prepared from trimethylolpropane and propylene oxide, with an OH group content in the range from 5.1 to 12.8% by weight and a weight average molecular weight of from about 400 to 1000 g/mol.

5. The solar module according to claim 1, wherein the cast polyether-polyurethane resin has an NCO/OH ratio in the range from 0.3 to 0.8.

6. The solar module according to claim 5, wherein the cast polyether-polyurethane resin has an NCO/OH ratio of 0.5.

7. The solar module according to claim 1, wherein the cast polyether-polyurethane resin further comprises an adhesion promoter to increase the adhesion of the resin to one or more of the front plate, the support plate, and the solar cells.

8. The solar module according to claim 1, wherein the cast polyether-polyurethane resin further comprises an ultraviolet-radiation-absorbing additive.

9. The solar module according to claim 1, wherein the cast polether-polyurethane resin further comprises dibutyltin dilaurate as a curing catalyst.

10. The solar module according to claim 1, wherein the front plate comprises glass.

11. A method for preparation of a solar module, comprising:

providing a front plate and a rear support plate placed in parallel and having one or more solar cells placed therebetween, such that hollow space is present between the front plate and the rear support plate;

filling said hollow space with a cast polyether-polyurethane resin; and curing the cast polyether-polyurethane resin.

12. The method according to claim 11, wherein the cast polyether-polyurethane resin comprises a reactive mixture of one or more aliphatic isocyanate prepolymers and one or more polyetherpolyols.

13. The method according to claim 12, wherein the one or more aliphatic isocyanate prepolymers comprise(s) a tri-functional aliphatic polyisocyanate prepared from 1,6-hexamethylene diisocyanate, having a biuret or isocyanurate structure, with an NCO group content of from 12.6 to 28% by weight and a weight average molecular weight of from about 450 to 1000 g/mol.

14. The method according to claim 12, wherein the one or more polyetherpolyols comprise(s) a polyetherpolyol prepared from trimethylolpropane and propylene oxide, with an OH group content in the range from 5.1 to 12.8% by weight and a weight average molecular weight of from about 400 to 1000 g/mol.

15. The method according to claim 11, wherein the cast polyether-polyurethane resin has an NCO/OH ratio in the range from 0.3 to 0.8.

16. The method according to claim 15, wherein the cast polyether-polyurethane resin has an NCO/OH ratio of 0.5.

17. The method according to claim 11, wherein the cast polyether-polyurethane resin further comprises one or more members selected from the group consisting of adhesion promoters, ultraviolet-radiation-absorbing compounds, and dibutyltin dilaurate as a curing catalyst.

18. The method according to claim 11, wherein the front plate comprises glass.

19. The method according to claim 11, wherein during the curing step the solar module is subjected to an overpressure in a range from about 0.3 to 1 bar.

20. The method according to claim 11, wherein the curing step is performed at a temperature of from 30° to 50° C. for a time of from 30 minutes to 5 hours.

* * * * *